United States Patent
Binkley et al.

(10) Patent No.: US 7,148,717 B2
(45) Date of Patent: Dec. 12, 2006

(54) METHODS AND APPARATUS FOR TESTING ELECTRONIC CIRCUITS

(75) Inventors: David M. Binkley, Charlotte, NC (US); Rafic Zein Makki, Charlotte, NC (US); Thomas Paul Weldon, Charlotte, NC (US); Ali Chehab, Beirut (LB)

(73) Assignee: University of North Carolina at Charlotte, Charlotte, NC (US)

( * ) Notice: Subject to any disclaimer, the term of this patent is extended or adjusted under 35 U.S.C. 154(b) by 0 days.

(21) Appl. No.: 10/900,915

(22) Filed: Jul. 28, 2004

(65) Prior Publication Data

US 2004/0263198 A1    Dec. 30, 2004

Related U.S. Application Data

(62) Division of application No. 10/237,670, filed on Sep. 10, 2002, now Pat. No. 6,833,724.

(60) Provisional application No. 60/318,599, filed on Sep. 10, 2001.

(51) Int. Cl.
*G01R 31/26* (2006.01)

(52) U.S. Cl. ..................................... 324/765

(58) Field of Classification Search ............... 324/765, 324/158.1, 769, 763, 760; 714/724, 734–736
See application file for complete search history.

(56) References Cited

U.S. PATENT DOCUMENTS

| | | | |
|---|---|---|---|
| 5,332,973 A | 7/1994 | Brown et al. | |
| 5,731,700 A | 3/1998 | McDonald et al. | |
| 5,808,476 A | 9/1998 | Lee et al. | |
| 6,144,214 A | 11/2000 | Athan | 324/763 |
| 6,169,408 B1 | 1/2001 | Kantor et al. | 324/752 |
| 6,195,772 B1 | 2/2001 | Mielke et al. | |
| 6,301,168 B1 | 10/2001 | Crocker | 365/201 |
| 6,342,790 B1 | 1/2002 | Ferguson et al. | 324/765 |
| 6,414,511 B1 | 7/2002 | Janssen et al. | 324/769 |
| 6,580,281 B1 * | 6/2003 | Falk | 324/751 |

OTHER PUBLICATIONS

PCT US02/28564, International Search Report mailed Mar. 7, 2003.
C. Thibeault, "Improving Delta-IDDQ-based test methods", *Int. Test Conf.*, 2000, pp. 207-216.
C. Thibeault, "An Histogram Based Procedure for Current Testing of Active Defects," *Int. Test Conf.*, 1999, pp. 714-723.

(Continued)

*Primary Examiner*—Jermele Hollington
*Assistant Examiner*—Tung X. Nguyen
(74) *Attorney, Agent, or Firm*—Kilpatrick Stockton LLP

(57) ABSTRACT

Methods and apparatus are provided for testing to determine the existence of defects and faults in circuits, devices, and systems such as digital integrated circuits, SRAM memory, mixed signal circuits, and the like. In particular, methods and apparatus are provided for detecting faults in circuits, devices, and systems using input control signals to generate controlled-duration, controlled pulse-width, transient power supply currents in a device under test, where said transient power supply currents are of controllable bandwidth and can be used as observables to determine faulty or defective operation. Additionally, methods and apparatus are provided to permit high bandwidth sensing of transient supply currents as need to preserve the narrow widths of these current pulses. These methods may include autozero techniques to remove supply current leakage current and DC offsets associated with practical current sensing currents. The sensed transient supply currents can be compared to single or multiple thresholds to assess normal or faulty or defective operation of the device under test.

6 Claims, 15 Drawing Sheets

OTHER PUBLICATIONS

A. C. Miller, "IDDQ Testing in Deep Submicron Integrated Circuits," *Int. Test Conf.*, 1999, pp. 724-729.

K. Baker, "SIA Roadmaps: Sunset Boulevard for IDDQ", *Int. Test Conf.*, 1999, p. 1121.

D. Bhavsar, "ITC99" Panels,*IEEE Design & Test*, vol. 16, No. 4, Oct.-Dec. 1999, pp. 96-99.

C. F. Hawkins, J. M. Soden, "Deep Submicron CMOS Current IC Testing: Is There a Future?" *IEEE Design & Test*, vol. 16, No. 4, Oct.-Dec. 1999, pp. 14-15.

J. F. Frenzel and P. N. Marinos, "Power Supply Current Signature (PSCS) Analysis: A New Approach to System Testing", *Int. Test Conf.*, 1987, pp. 125-135.

S. Su, R. Makki, T. Nagle, "Transient Power Supply Current Monitoring—A New Test Method for CMOS VLSI Circuits," *Journal of Electronic Testing: Theory and Applications*, pp. 23-43, Feb. 1995.

S. Su and R. Makki, "Testing Random Access Memories by Monitoring Dynamic Power Supply Current", *Journal of Electronic Testing: Theory and Applications*, pp. 265-278, 1992.

A. Germida, Z. Yan, J. Plusquellic, F. Muradali, "Defect Detection using Power Supply Transient Signal Analysis," *Int. Test Conf.*, 1999, pp. 67-76.

W. Jiang, B. Vinnakota, "IC Test Using the Energy Consumption Radio", *Design Automation Conference*, 1999, pp. 976-981.

W. Jiang, B. Vinnakota, "Statistical Threshold Formulation For Dynamic $I_{dd}$ Test", *Int. Test Conf.*, 1999, pp. 57-66.

M. Sachdev, P. Janssen, V. Zieren, "Defect Detection with Transient Current Testing and its Potential for Deep Sub-micron CMOS ICs," *Int. Test Conf.*, 1998, pp. 204-213.

J. Liu, R. Makki, A. Kayssi, S. Su, "An Economical Method for Detecting Disturb Faults In CMOS SRAMs," *IEEE Proceedings of the Economics of Design, Test and Manufacture*, Oct. 1996.

\* cited by examiner

METHODS AND APPARATUS FOR TESTING ELECTRONIC CIRCUITS

The present application is a divisional of U.S. patent application Ser. No. 10/237,670, filed Sep. 10, 2002, now U.S. Pat No. 6,833,724 which claims priority to co-pending U.S. Provisional Application No. 60/318,599, filed Sep. 10, 2001, the entire contents of both of which are incorporated herein by reference.

FIELD OF THE INVENTION

The present invention relates to methods and apparatus for testing of faults and defects within electronic devices, such as semiconductor memory circuits.

BACKGROUND OF THE INVENTION

Electronic devices such as memory chips can contain undesired faults and defects that arise due to imperfections in manufacturing processes. These faults and defects include open circuits, short circuits, and out-of-tolerance components. Testing for these faults during manufacture is impractical and costly in light of the new process technologies currently being used to manufacture electronic circuits and devices. Therefore, self-test circuits have been incorporated within modern circuits and devices in order to improve reliability, to eliminate defective and faulty circuits and devices, and to reduce cost.

One example of an incorporated self-test circuit measures the quiescent DC power supply current. This method is referred to as the $I_{DDQ}$ method. In the $I_{DDQ}$ method, power supply currents outside a predetermined range indicate a faulty circuit or device. Examples of this method can be found in U.S. Pat. Nos. 6,342,790, 6,301,168, and 6,144,214. In general, an apparatus incorporating quiescent DC power supply current for self-test monitors the current from a power supply using a current sensor. Therefore, the apparatus effectively monitors the supply current delivered to the Device Under Test (DUT) and transmits a final output signal that is in proportion to the supply current delivered to the DUT. The final output signal is analyzed to determine whether or not any faults exist in the DUT.

The $I_{DDQ}$ method, however, requires quiescent defect currents of appreciable magnitude relative to the quiescent currents in fault-free circuits and devices. But the difference between faulty currents and fault-free currents may be negligible in many components. Moreover, quiescent leakage currents associated with emerging technologies are large enough to render these $I_{DDQ}$ methods ineffective in detecting faulty circuits.

These emerging technologies include deep sub-micron integrated circuit technology. Sub-micron circuits have increased leakage currents and associated large DC supply currents that greatly reduce the effectiveness of the $I_{DDQ}$ methods. Additional challenges to testing of sub-micron circuits include significant increases in circuit size, rapid increases in clock frequencies, the dominance of the interconnect delay, the transmission-line behavior of interconnects, the reduced level of the power supply voltage, the increase in leakage currents, the increase in power consumption, and the increased sensitivity of circuit arrangements to process defects. Therefore, fault monitoring circuitry was developed for measurement of the transient power supply current. Methods employing such circuitry are referred to as $I_{DDT}$ methods wherein transient power supply currents outside a predetermined range indicate a faulty circuit or device.

U.S. Pat. No. 6,414,511 discloses an example of an $I_{DDT}$ method. In general, an apparatus incorporating transient power supply current for self-test monitors the current from the power supply using a current sensor. Therefore, the apparatus effectively monitors the transient supply current delivered to the Device Under Test (DUT) and transmits a final output signal that is in proportion to the transient supply current of the DUT. The final output signal is analyzed to determine whether or not any faults exist in the DUT.

Prior implementations of the $I_{DDT}$ methods, however, do not adequately address the need for large bandwidths to handle the extremely short duration underlying transients in deep sub-micron technology. These prior methods have relied on dubious and inadvertent integration of the high-speed transients (i.e., lowpass filtering of transients) to allow slower circuits to process the transients. In such methods, the extremely high-speed transients native to the DUT are the transients being observed and measured for the purpose of detecting faulty circuits. The associated high-speed transients have led to over-simplified and questionable solutions, which have not found application in industry. Moreover, the bandwidth of such transients in digital circuits are by their very nature faster than the highest clock speeds of the circuit, since the duration of the transient is commonly shorter than the logic rise and fall times.

Therefore, a need exists to find alternative methods and apparatus that effectively and practically utilize transient power supply currents in testing devices and circuits for faults and defects. Suitable methods and apparatus should be capable of testing with little disruption of the circuits under test, with little added hardware, and with minimal effect on manufacturing costs. In addition, suitable methods and apparatus should be capable of the necessary testing at lower speeds and bandwidths to be advantageous for implementations in circuits, devices, and systems.

SUMMARY OF THE INVENTION

The present invention is directed to apparatus and methods for detecting faults in circuits, devices, and systems. Suitable circuits, devices and systems include integrated circuits for memory cells, combinational logic, mixed-signal circuits, analog circuits, and the receiver and transmitter portions of cellular phone handsets. In memory chips, the transient supply current apparatus and methods can be used to detect faulty memory cells and memory chips. Similarly, transient supply current apparatus and methods can be used to detect faulty devices and sub-circuits within combinational logic, mixed-signal circuits, and analog circuits.

In one embodiment of the present invention, an apparatus for controlled pulse-width transient power supply testing is used. The apparatus includes a current measuring device, a Device Under Test (DUT) such as a Static Random Access Memory (SRAM) cell or a bank of memory cells, and input control signals including a test-pulse generator and control signals to set signal levels within the DUT. Suitable current measurement devices are capable of measuring the transient current delivered to the DUT. The test-pulse generator includes at least one output that is electrically coupled to and in communication with the DUT. In operation, the test-pulse generator controls the DUT to generate a transient power supply current within a sub-circuit of the DUT. This transient power supply current is of a controlled pulse-width and duration. The generated transient current is monitored and measured by the current measurement device. The measured transient current is then analyzed for indications of defects or faults in the DUT.

In another embodiment of the present invention, digital portions of the DUT are analyzed. In this embodiment, the DUT is exposed to a plurality of input control signals. One or more signals from this plurality of input control signals are selected and set to cause signal levels internal to the digital portions of DUT to have values that are intermediate to the logic levels. For example, the logic levels are about 0 volts and about 5 volts and the intermediate voltage level within the digital portion is about 2.5 volts. These intermediate values in conjunction with the other input control signals help induce DUT power supply current of a controlled pulse-width and duration that is then monitored for deviations from values for fault-free devices, such deviations indicating a faulty circuit.

In another embodiment of the present invention, the apparatus includes a first resistor which is coupled into the supply current lead of the DUT, and a high pass filter containing a capacitor and a second resistor is electrically coupled to the DUT supply line between the DUT and the first resistor. The second resistor is then electrically coupled to a cascade of a plurality of wideband voltage amplifiers. The output of the amplifiers is electrically coupled to a comparator circuit. In operation, the first resistor converts the supply current transients to voltage transients. The current transients can be native to the DUT or deliberately introduced. These voltage transients are then AC coupled through the capacitor and second resistor to reject the DC voltage associated with the high leakage current while preserving the shape and magnitude of the voltage pulses. These voltage pulses, i.e. the $I_{DDT}$ supply current pulses, are amplified by the plurality of differential, wideband amplifiers. The comparator assesses the output from the amplifiers to determine normal or abnormal operation of the DUT.

The apparatus and methods of the present invention provide the unexpected results and advantages of direct observability into the switching profile of the DUT. In addition, the test time is significantly reduced since it is not necessary for a circuit to reach steady-state or static supply current operation following test stimuli. The apparatus and method of the present invention eliminate measurement problems associated with quiescent current and are particularly well suited for emerging sub-micron technologies. Since faults can be assessed directly form the transient supply current, the need for separate read operations is eliminated. The apparatus and methods of the present invention detect a wide range of faults and defects including resistive opens and shorts, capacitive opens, pattern sensitive faults, tunneling, and crosstalk. The method and apparatus of the present invention substantially reduce test costs and improve fault coverage. The need to implement costly test methods such as separate test pins or supply partitioning to overcome limitations of large leakage currents is eliminated.

DETAILED DESCRIPTION

Figure 1:
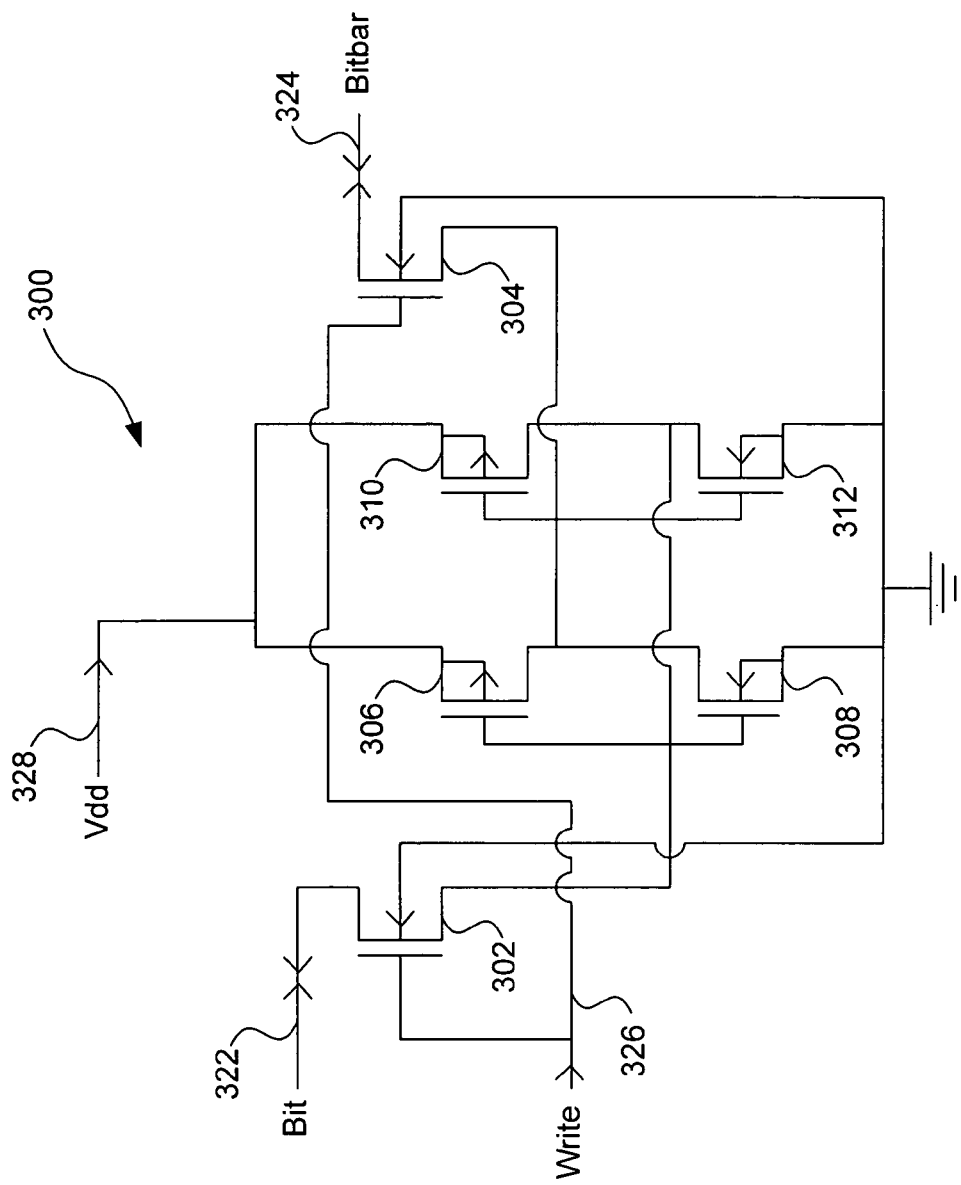
FIG. 1 is an electrical schematic of a device to be tested by the method and apparatus of the present invention.

The method of the present invention can be used to test various types of electronic circuits and devices and is particularly well suited for sub-micron circuits and devices. Referring initially to FIG. 1, an example of a Device Under Test (DUT) 300 suitable for testing with the apparatus and method of the present invention is illustrated. The illustrated DUT 300 is a 6-transistor CMOS SRAM cell. The DUT receives DC power through an input power supply Vdd line 328 coupled to a suitable DC power source (not shown). The SRAM cell of the DUT 300 includes four n-channel enhancement-mode field effect transistors (NFET) 302, 304, 308, 312 and two p-channel enhancement-mode field effect transistors (PFET) 306, 310. Read/write access is provided to the DUT by a logic high signal through the write signal line 326, and the input or output data are obtained through bi-directional signals bit line 322 and bitbar line 324.

Figure 2:
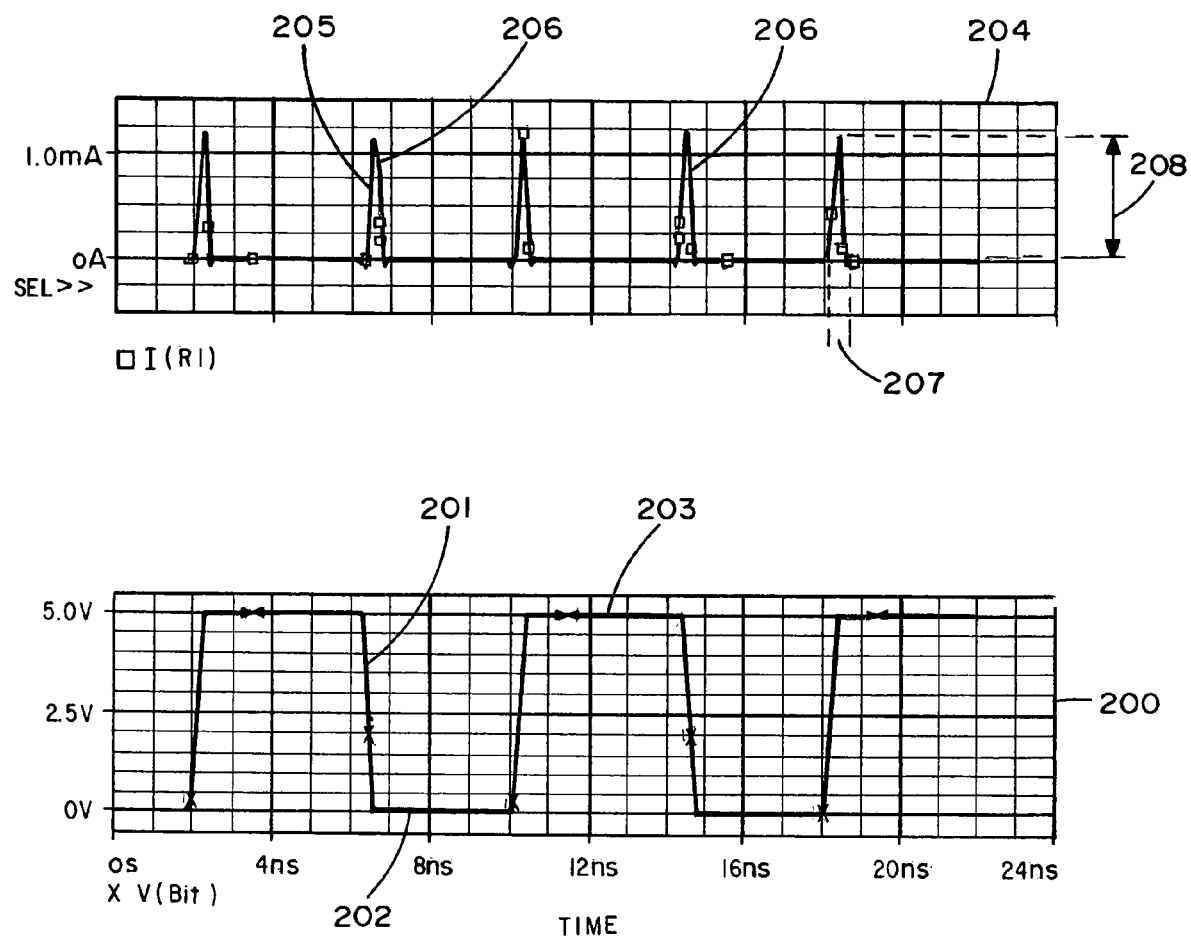
FIG. 2 is a graph illustrating transient supply currents in a device under test.

The high bandwidth of transient power supply currents associated with the DUT 300 are illustrated in FIG. 2. Transient supply currents are simulated for a write operation on the 6-transistor SRAM cell 300 for a 0.5 micron CMOS process. The bottom graph 200 represents the signal 201 at the bit line 322 (the signal at the bitbar line 324 having the opposite logical level). The signal 201 alternates from a logic low 202 of about 0 volts to a logic high 203 of about 5 volts. The voltage at both the power supply line 328 and the write signal line 326 is a constant 5 volts. The upper graph 204 illustrates the power supply current 205 in the power supply line 328. The power supply current includes a plurality of transient current pulses 206 having peak currents 208 of approximately 1.15 milliampere and having durations 207 of less than about one nanosecond with correspondingly high associated bandwidths. The width of the transient current pulses or durations 207 are on the order of the rise time between logic low 202 and logic high 203 states and are typically difficult to process and test.

Figure 3:
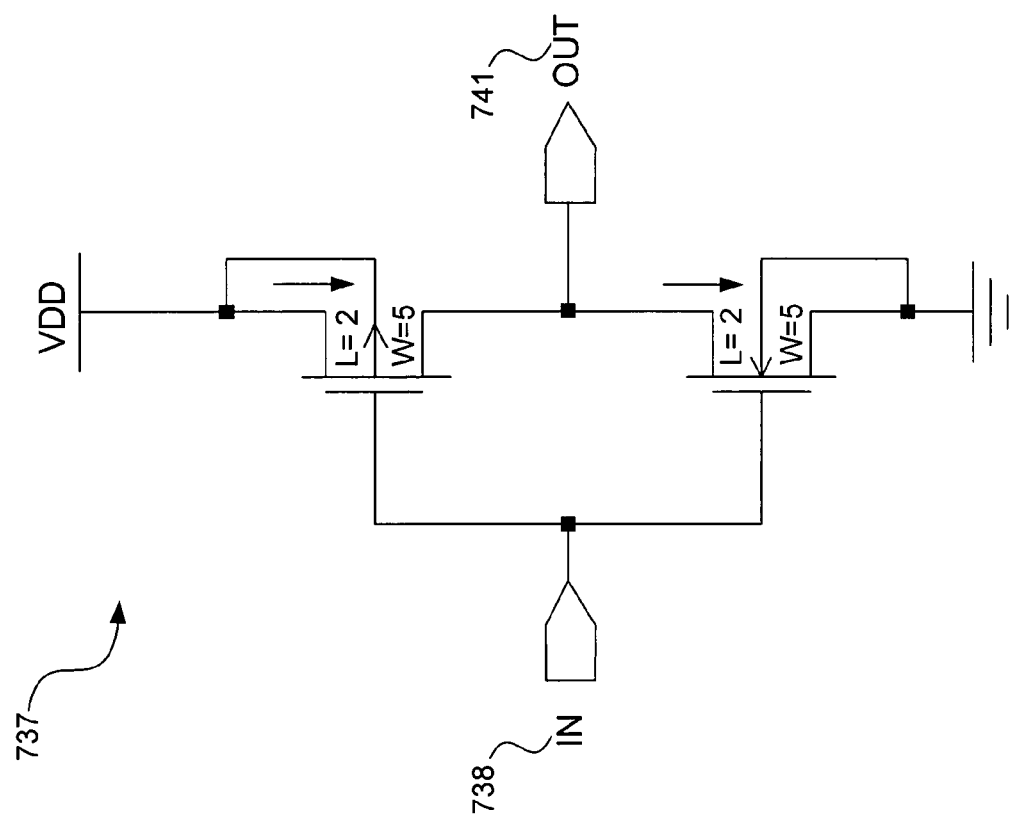
FIG. 3 is a schematic of a CMOS inverter.
Figure 4:
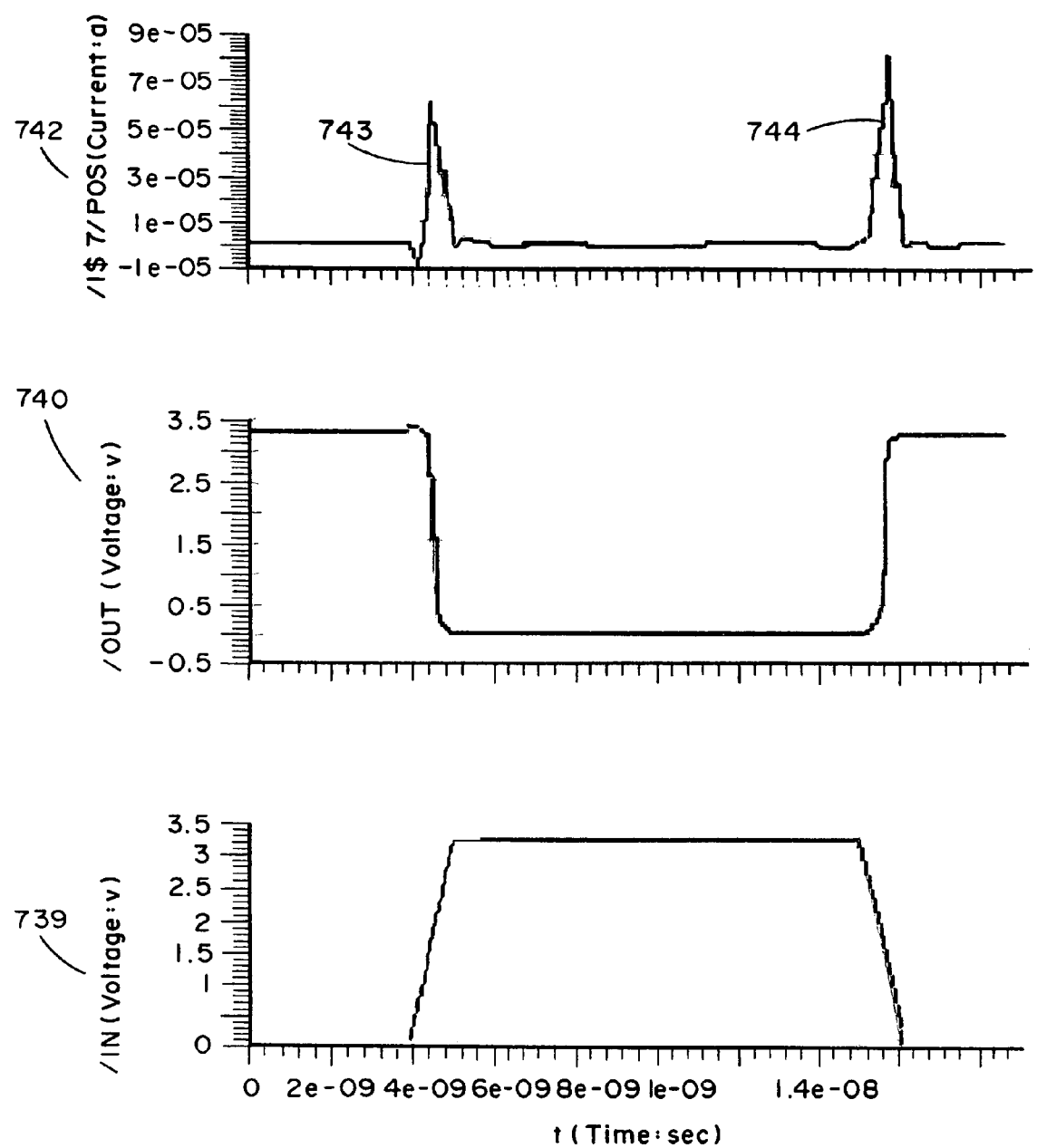
FIG. 4 is a graph illustrating transient supply current spikes in the CMOS inverter.

Referring to FIG. 3, a CMOS inverter 737 is illustrated. The CMOS inverter 737 is based on a 0.35-micron process technology and has a supply voltage $V_{DD}$ of about 3.3V. Operation of the CMOS inverter 737 can be simulated for the case when the signal delivered to the CMOS inverter input 738 transitions from a low logic state 0 to a high logic state 1 followed by a transition from the high logic state 1 to the low logic state 0. Referring to the graphs in FIG. 4, the bottom graph 739 illustrates the logic states at the inverter input 738. The logic low state or 0 is represented by a voltage of about 0 volts, and the logic high state or 1 is represented by a voltage of about 3.3 volts. The middle graph 740, represents the output signal from the CMOS inverter as measured at the output 741. As illustrated, the input and output signals have opposite values. As is shown in the top graph 742, the logic state transitions produce a first transient current, $I_{DDT}$, spike 743 having a magnitude of about 58 µA and a second $I_{DDT}$ spike 744 having a magnitude of about 86 µA. These spikes represent the transient supply currents that can be measured for fault or defect detection. The desired $I_{DDT}$ is generated by creating the necessary logic states at the circuit input. When the CMOS inverter is incorporated in a larger device, the input signals to that device are manipulated to create the desired inputs in the sub-component CMOS inverter. The power input to that larger device is then monitored for the first and second spikes associated with that logic transition on the CMOS inverter.

Figure 5:
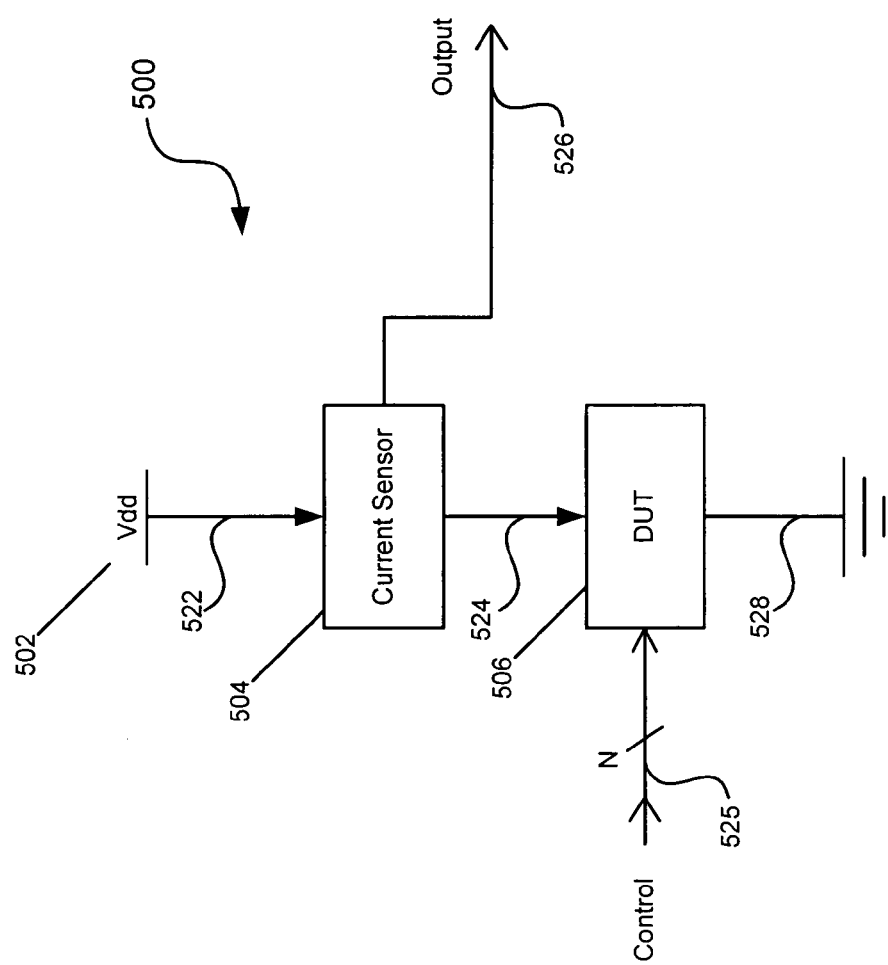
FIG. 5 is a schematic of one embodiment of the apparatus of the present invention.

The present invention is directed to apparatus and methods for determining defects and faults in electronic devices having at least one input that is coupled between a power supply and a ground to receive a supply current therefrom. In one embodiment of the present invention, as illustrated in FIG. 5, an arrangement 500 for detecting faulty or defective circuits that employs controlled pulse-width measurement of transient power supply current, hereafter called $I_{DDP}$, is illustrated. Controlled pulse-width transient power supply currents outside a predetermined range indicate a faulty circuit or device. The arrangement 500 includes an input control signal bus 525 having a plurality of signals. As illustrated, the input control signal bus includes N signals. The input control signal bus is in electrical contact with the DUT 506 such that it can deliver one or more of the plurality of signals to the DUT. The DUT includes a plurality of inputs for electrical coupling to the input control signal bus for receiving one or more of the plurality of signals. The apparatus also includes a power supply 502 having at least one input. Suitable power supplies are capable of supplying the necessary supply voltages and currents to the apparatus and DUT and are readily available and known in the art. The power supply is electrically coupled to a current sensor 504 by line 522. Suitable current sensors are capable of monitoring the current supplied from the power supply 502. This arrangement monitors the supply current delivered to the DUT through the DUT supply current line 524 electrically coupled between a first output of the current sensor 504 and the DUT 506. The current sensor includes a second output containing a final output signal line 526 that delivers a final output signal in proportion to the supply current in the DUT supply current line 524. The DUT is connected to ground by the ground lead 528.

In operation, the input control signal bus 525 delivers one or more of the plurality of input control signals to the DUT 506, causing a first plurality of devices, components, or circuits within DUT 506 to conduct current. The voltage and current levels of the control signals are adjusted to affect varying levels of currents in the DUT 506 and to selectively choose to activate different devices or components within the DUT 506 as desired to generate transient supply current pulses capable of being observed at the second output of the current sensor. Either signal currents or signal voltages can be used. In addition, the input signals can be adjusted to control the pulse-width of the current conducted within the DUT. Therefore, the devices, components, or circuits within the DUT will conduct the current for the duration of the defined controlling pulse-width. The sum of the conducted currents from this first plurality of devices is the current delivered to the DUT through the supply current line 524. The current sensor 504 monitors this supplied current and outputs a proportional final output signal through the output signal lead 526. The final output signal is monitored and analyzed for defects or faults in the devices, components, or circuits selected to conduct current. In an alternative embodiment, one or more controlled pulse-width signals on signal bus 525 can be used. In addition, quiescent or DC components appearing in final output signal 526 can be removed or accounted for when analyzing for faults.

The DUT also includes at least one digital portion. In an embodiment for testing digital portions of the DUT 506, selected signals from the plurality of signals on the input control signal bus 525 are typically set to force voltages within those digital portions to be intermediate levels. The digital portion is responsive to a first voltage corresponding to a logic low state and a second voltage corresponding to a logic high state. The input control signals can be selected to expose the digital portion to a third voltage between the first voltage and the second voltage. For example, the intermediate voltage level can be about 2.5 volts for a logic low voltage level of about 0 volts and a logic high level of about 5 volts).

Figure 6:
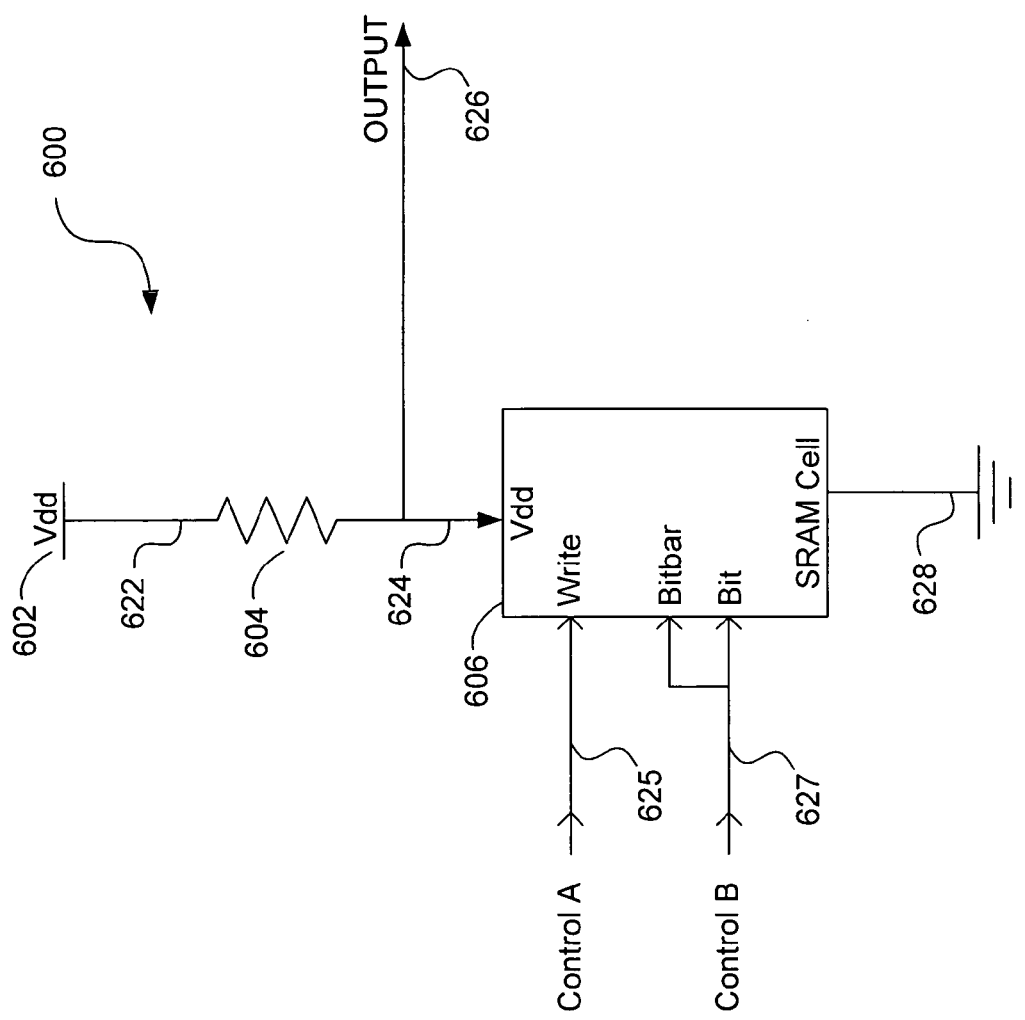
FIG. 6 is a schematic of another embodiment of the apparatus of the present invention.

In another embodiment of the present invention, as illustrated in FIG. 6, an arrangement 600 is provided for detecting faulty or defective Static Random Access Memory (SRAM) circuits using $I_{DDP}$ methods. The arrangement 600 includes a first input control signal lead 625 (Control A) and a second control signal lead 627 (Control B) electrically coupled to the SRAM DUT and capable of delivering logical control signals to the SRAM. Both current signals and voltage signals can be used. In one embodiment, the first control signal lead 625 is connected to the Write input of the SRAM, and the second control lead 627 is connected to the Bit and BitBar inputs of the SRAM. An input power supply 602 is provided that is capable of providing the necessary voltages and currents to the arrangement. Suitable power supplies are readily available and known in the art. A current sensing resistor 604 is electrically coupled between the power supply 602 and the SRAM by suitable current supply lines 622,624. The current sensing resistor monitors the input current from the power supply 602, and the DUT is connected to ground through signal line 628. A final output signal lead 626 is electrically coupled to the current supply line 624 between the current sensing resistor 604 and the SRAM 606. Therefore, the input power supply current delivered to the SRAM 606 is monitored, and a final output signal that is in proportion to this supply current is transmitted through the final signal output lead 626. The value of observed currents in current supply line 624 induce a voltage proportional to the current appearing on final output lead 626 that is monitored and compared to predetermined values that are associated with normal fault-free operation of the DUT. Differences between the predetermined values and the observed values indicate the presence of defects and faults in the DUT. In an alternative embodiment, quiescent or DC components appearing in final output signal 626 may be removed or accounted for when analyzing the output signal.

In one embodiment, the final output signal is proportional to the power supply current multiplied by a selected negative constant. Quiescent or DC components appearing in the final output signal may be removed or appropriately processed or accounted for during analysis of the output signal. For purposes of illustration, the output signal 626 is assumed to not load or drain current from the remainder of the circuit, and for nominal purposes the resistance of sensing resistor 604 is 1 ohm. If the SRAM 606 has a schematic and pin diagram corresponding to those shown in apparatus 300 of FIG. 1, the second control signal lead 627 is connected to pins bit and bitbar 322, 324 and is set to a constant voltage, for example one half of the supply voltage or 2.5 volts if the supply is 5 volts. The first control signal lead 625 is electrically coupled to Write pin 326. By selecting the DC voltage delivered through the second control signal lead, the transistors within the SRAM 606 are induced to conduct current during the logic-high state delivered through the first control signal lead 625. These induced currents cause a current through the current supply lines 624 producing an observable output signal through the output signal lead 626. The duration of the current pulse through the current supply line 624 corresponds to the duration of the control signal delivered through the first control signal lead 625.

The voltage and current levels delivered to the SRAM through the first and second control signal leads 625, 627 can be adjusted to affect current levels in the SRAM 606 and to select different devices in the SRAM 606 to activate. In an alternative embodiment, signals delivered to the SRAM through the first signal lead 625 can be held at a constant 5 volts (logic high), and the input signal delivered to the bit and bitbar pins through the second signal lead 627 can be set to pulses with predetermined amplitude and predetermined DC bias level, so as to effect correspondingly similar transient controlled-duration power supply current pulses.

Figure 7:
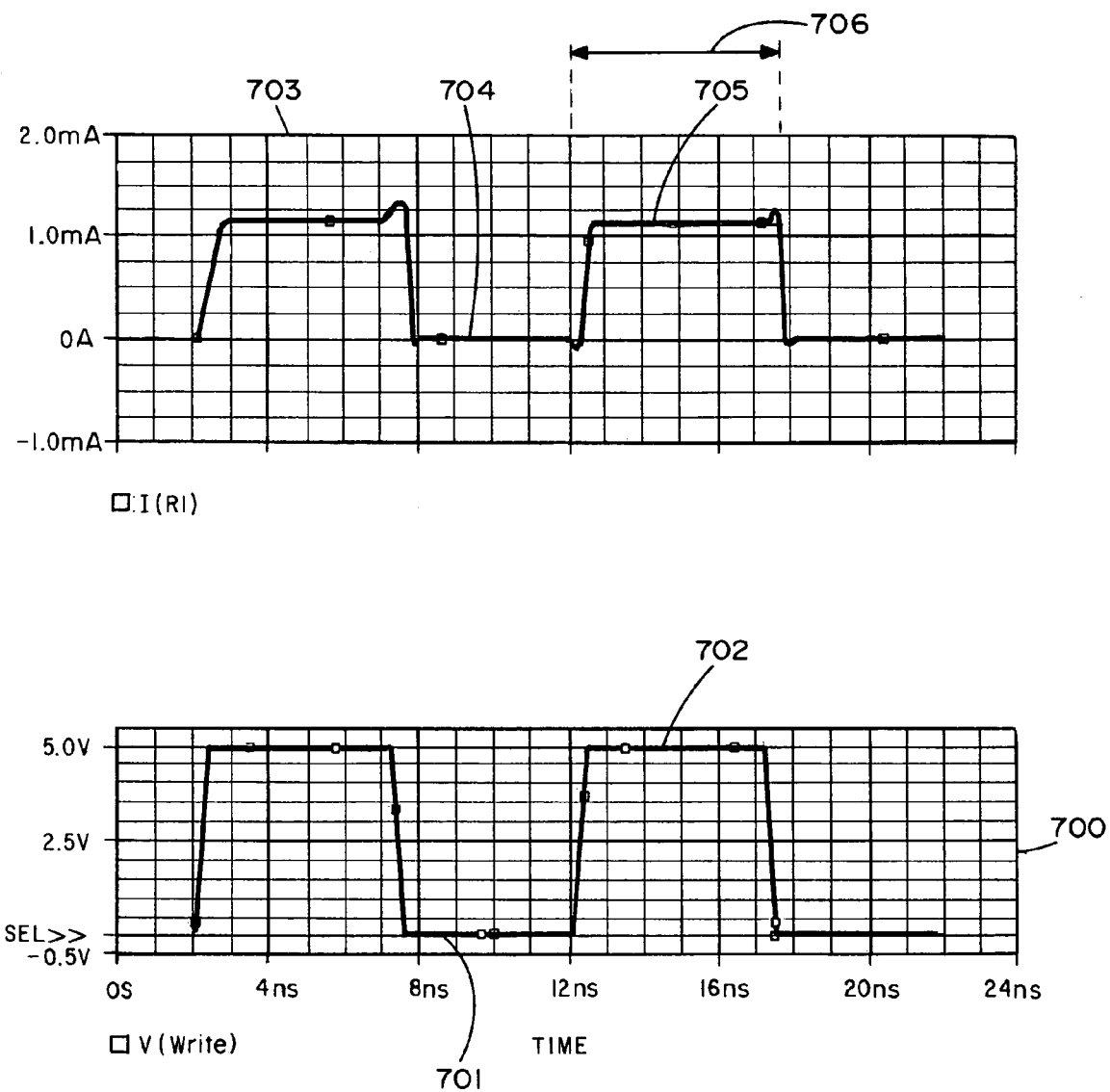
FIG. 7 is a graph of the transient current pulses associated with an embodiment of the apparatus of the present invention.

The electrical performance of this arrangement 600 is illustrated in FIG. 7 where controlled pulse-width transient supply currents are simulated for a 6-transistor SRAM cell in a 0.5 micron CMOS process. The lower graph 700 illustrates the signal delivered to the DUT through the first control signal lead 625 (i.e. the write pin of the SRAM 606). This control signal alternates between a logic low state 701 corresponding to about 0 volts and a logic high state 702 corresponding to about 5 volts. The voltage delivered by the voltage supply 602 is a constant 5 volts, and the control signal delivered in through the second signal lead 627 is constant at about 2.5 volts. The upper graph 703 illustrates the supply current 704 in the supply lead 622 between the power supply and the monitoring resistor 604. The transient current pulses 705 in the power supply current have controlled pulse-widths 706 whose durations are directly proportional to the duration of the high state 702 of the control signal in the first control lead 625. Therefore these pulses 705 have correspondingly low bandwidths due to the long duration of the pulse 705. These bandwidths can be controlled by varying the duration of the logic high state 702 pulse. In addition, the width of the transient current pulses are much longer than the rise time of the logic, and accordingly these pulses are easy to process. Referring to FIGS. 2 and 7, since the duration of pulse width 706 is longer than pulse width 207, the bandwidth of pulse width 706 is lower than pulse width 207.

Figure 8:
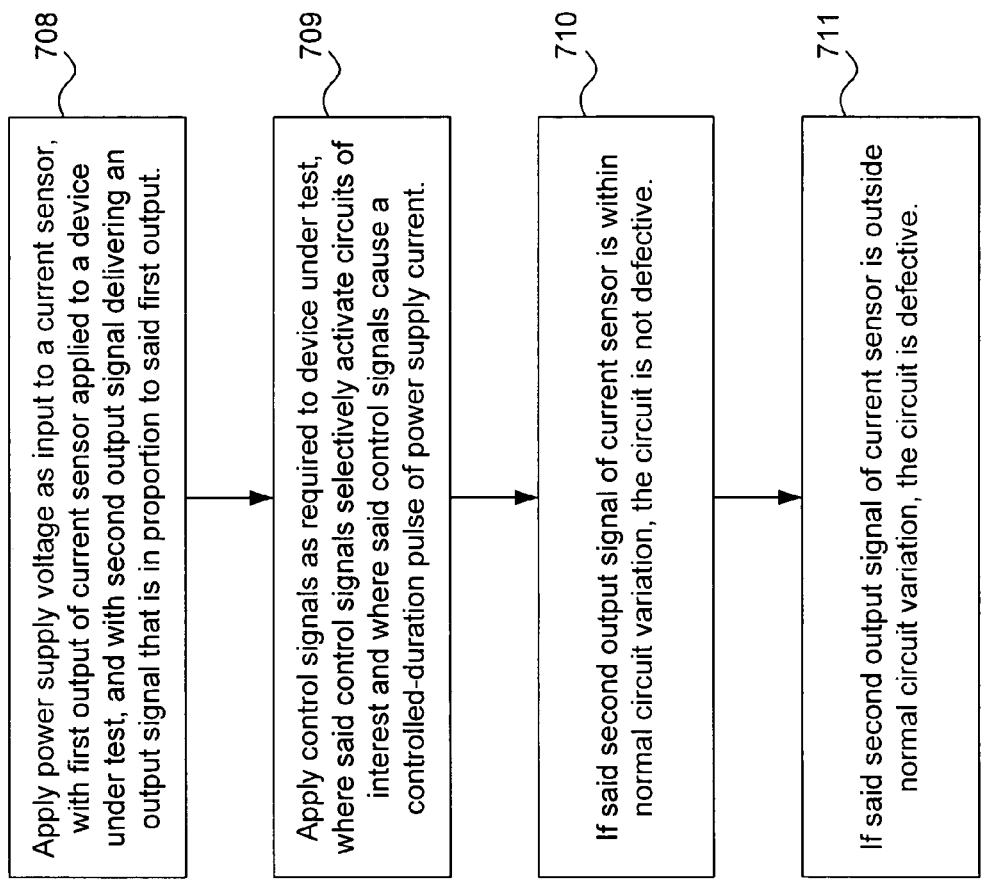
FIG. 8 is a flow chart illustrating one embodiment of the method of the present invention.

Referring to FIG. 8, an embodiment of the method of the present invention is illustrated. Initially, a power supply voltage is applied as input to a current sensor, with a first output of that current sensor applied to a DUT and a second output signal delivering an output signal that is in proportion to the signal in the first output 708. The second output is typically a voltage signal drawing no current. The current sensor senses current with minimal disruption of voltage and current delivered from the first output of the current sensor to the DUT.

Next, one or more logic control signals are applied as desired to one or more inputs of the DUT 709 to selectively activate circuits of interest within the DUT to cause a controlled-duration transient pulse of power supply current through selected components. Both signal voltages and signal currents can be used. The voltage and current levels of the control signals can be adjusted to affect the levels of currents in the DUT to selectively choose to activate different devices, components or circuits therein. The second signal output is monitored and analyzed, and if the second output signal of the current sensor is within normal circuit variation, the circuit is determined to not be defective 710. The nominal values of current delivered to the DUT will have some variation in manufacture, necessitating a range of current values for non-defective or fault-free circuits. If, however, the second output signal is unacceptably outside normal circuit variation, the circuit is determined to be defective 711.

In another embodiment of the present invention, the supply current transients are converted to voltage transients through a resistance, either parasitic or deliberately introduced, connected between the voltage supply and interior circuitry or components of the DUT. These small voltage transients or pulses are then AC coupled to reject the DC voltage associated with high leakage current while preserving the shape and magnitude of the voltage pulses. The voltage pulses, representative of the $I_{DDT}$ supply current pulses, are amplified by a cascade of a plurality of differential, wideband amplifiers. In one embodiment, four cascade amplifiers are used, each having a voltage gain of nearly four and a 3-dB bandwidth of 1.6 GHz. The composite voltage gain and bandwidth of the four amplifiers is approximately 233 and 550 MHz respectively, implying a very high gain-bandwidth product of 128 GHz. The high gain, combined with the rejection of DC leakage current through AC coupling, permits the sensor to detect small, e.g. 180 μA peak, transient supply currents in the presence of tens of milliamps of supply current leakage. This high bandwidth permits the sensor to assess supply current pulses having widths of approximately 1 ns, while permitting periodic test speeds of 200 MHz. This method is suitable for use in the testing of general analog, mixed-signal, and digital circuits in deeper submicron CMOS processes and emerging integrated circuit processes.

Figure 9:
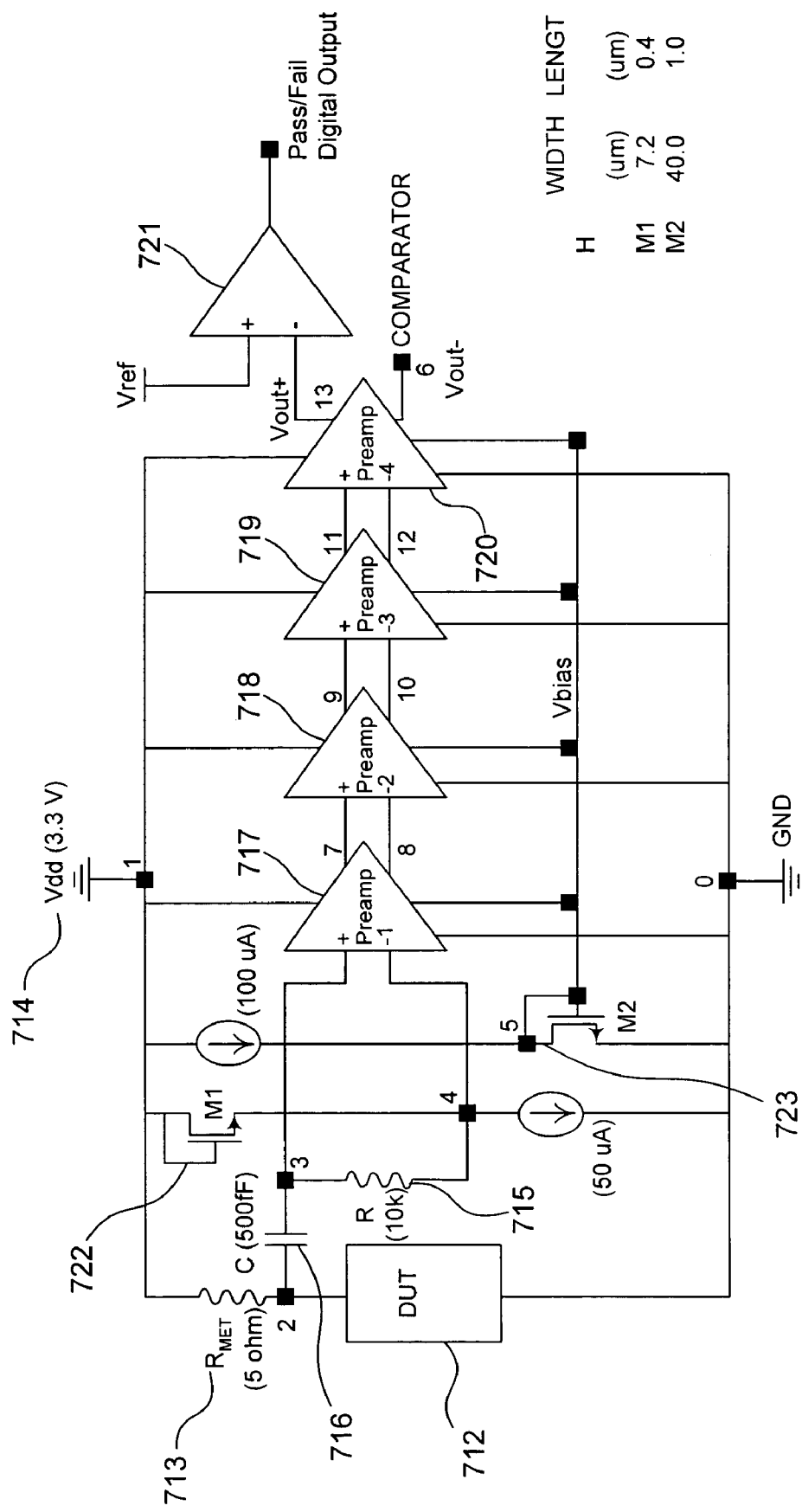
FIG. 9 is an electrical schematic of another embodiment of the apparatus of the present invention.

Referring to FIG. 9, an apparatus according to the present invention is illustrated. The $I_{DDT}$ current pulse resulting from the DUT 712 is converted to a voltage pulse by at least one first resistor 713 electrically coupled to the power supply 714. In one embodiment, the first resistor has a value of about 5 ohms. The output from the first resistor is AC coupled through a highpass network containing at least one capacitor 716 and at least one second resistor 715. This highpass network blocks the large DC voltages associated with DC supply current leakage ($I_{DDQ}$) while passing the small voltage pulse associated with the $I_{DDT}$ current pulse.

The high pass network is electrically coupled to a cascade of four, wideband voltage amplifiers 717, 718, 719, 720 to amplify the voltage pulse. Suitable amplifiers have a nominal gain of 4 and a 3 dB bandwidth of 1.5 GHz for a composite gain of approximately 233 at a 3 dB bandwidth of 550 MHz. In one embodiment, a comparator 721 is coupled to the output of the cascade amplifiers to assess the sensor output voltage and to determine normal or abnormal operation of the DUT. In another embodiment, multiple comparators are electrically coupled to the amplifier output. In yet another embodiment, an analog-to-digital (A/D) converter is electrically coupled to the amplifier output to provide for more comprehensive test evaluation. The current sensor illustrated is suitable for use with any sub-micron type DUT for example either a 0.35 µm or a 0.18 µm CMOS process. The high voltage gain combined with wide bandwidth permits processing of small $I_{DDT}$ current pulses with little bandwidth loss or corresponding increase in pulse width. In addition, the wide bandwidth performance permits $I_{DDT}$ testing at a repetition or clock rate of about 200 MHz. The apparatus also includes a first diode-connected NMOS device 722 electrically coupled between the power supply 714 and the first amplifier 717. The NMOS device provides a DC input common-mode level for the first amplifier that is appropriately below the power supply voltage. This input common mode level is $V_{DD}$-$V_{GS1}$, where $V_{DD}$ is the supply voltage and $V_{GS1}$ is the operating gate-source voltage of the first NMOS device 722. A second diode-connected NMOS device 723 is coupled between the power supply 714 and each amplifier to establish internal operating bias current for the four amplifier stages.

Figure 10:
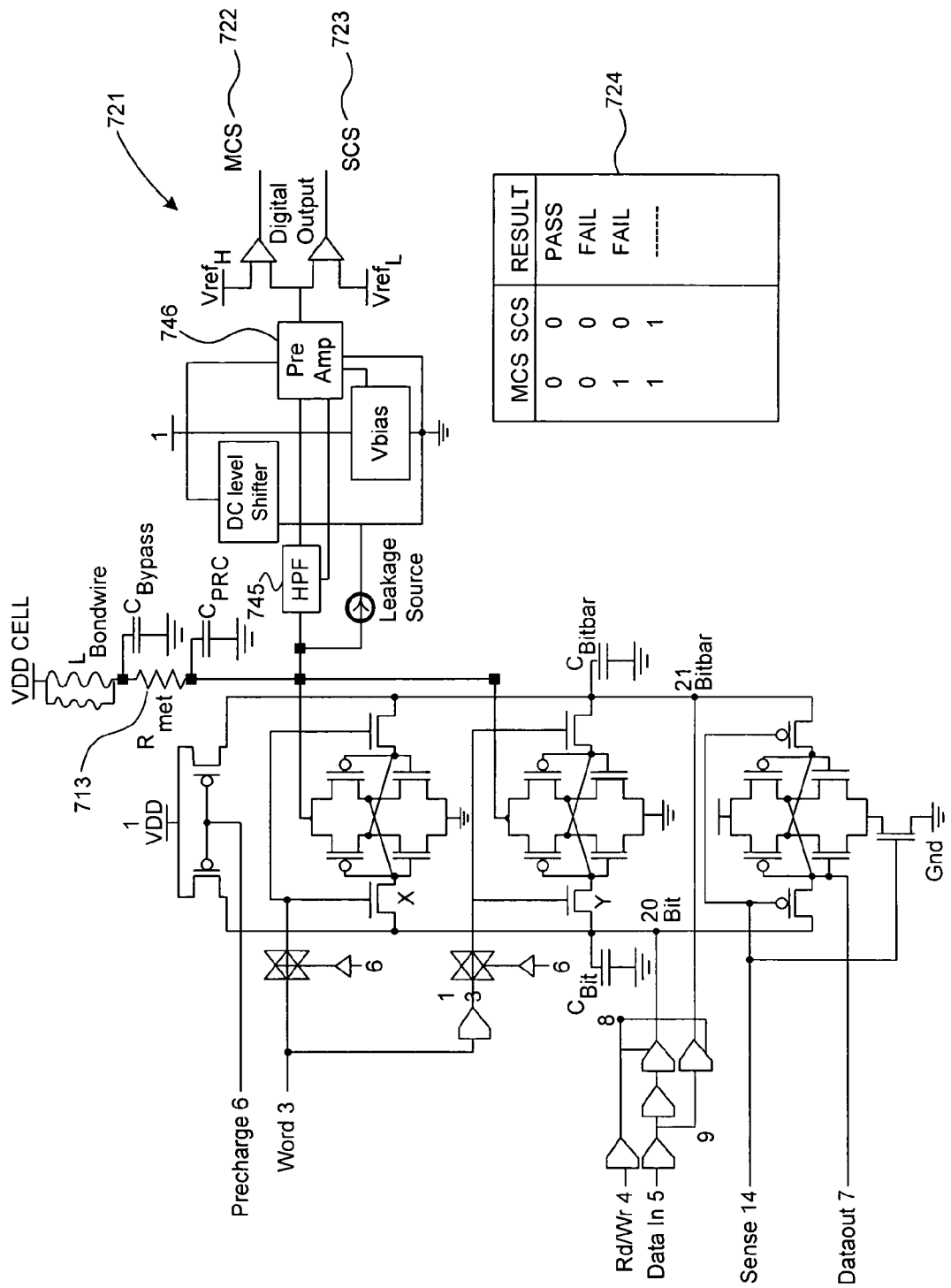
FIG. 10 is an electrical schematic of another embodiment of the apparatus of the present invention for testing SRAM.

Referring to FIG. 10, another view of the $I_{DDT}$ sensor interfaced with an SRAM is illustrated. A high pass filter 745 is provided as part of the transient current sensor to remove the leakage current, $I_{DDQ}$. The sensor also utilizes the first resistor 713 for converting the supply current to a voltage gain system 746 containing a plurality of cascaded amplifiers having a gain of over 200 and 3-dB bandwidth over 500 MHz. Although this bandwidth is not high enough to preserve the narrow width of the $I_{DDT}$ pulses, it does permit sufficient fidelity to obtain final voltage pulses greater than about 50 mV. These final pulse levels can be accurately discriminated by the comparator 721. Suitable comparators include analog CMOS voltage comparators having a pair of digital outputs, a multiple cell switching output 722 and a single cell switching output 723. In one example, the preamplifier 746 detects a peak of 0.12 mA and produces a peak-to-peak voltage of 160 mV that is fed into the comparator 721. The comparator 721 then produces either a logic high output or a logic low output at both outputs 722, 723. The output combination determines whether the tested circuit passes or fails as illustrated in the chart 724 in FIG. 14. For example, a high output, 1, at the multiple cell switching output 722 in combination with a low output, 0, at the single cell switching output 723 translates into a failure result for the tested circuit.

Figure 11:
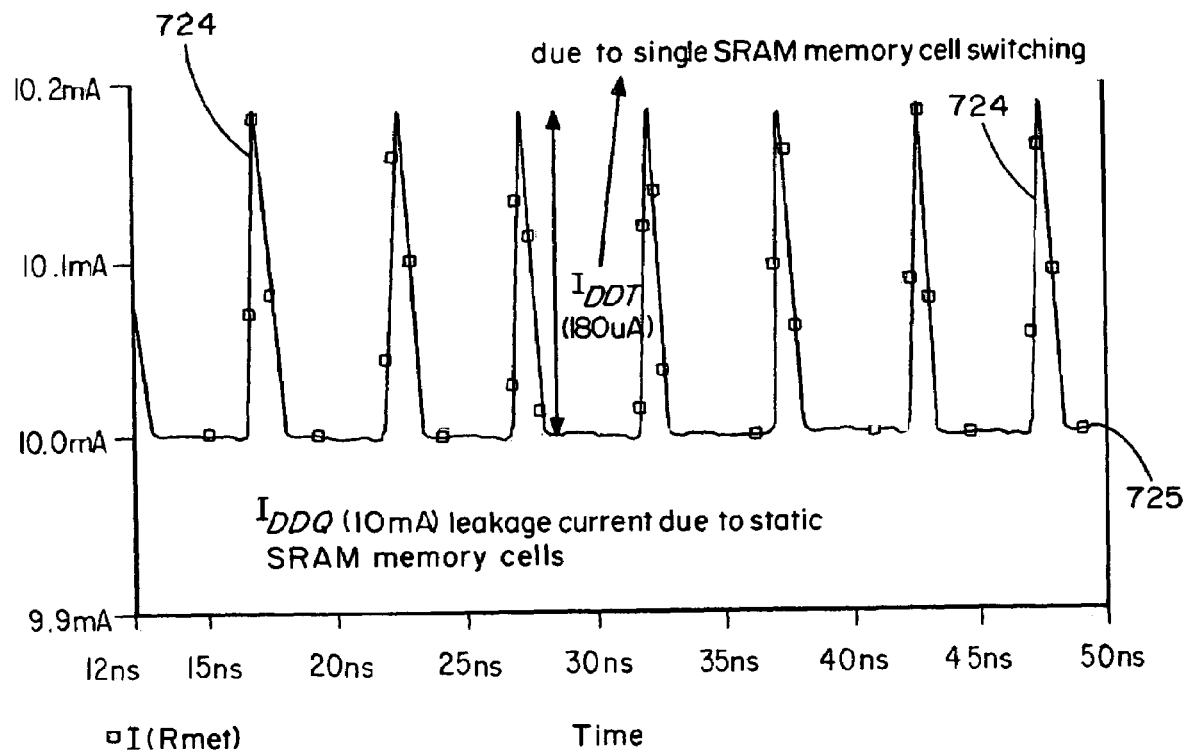
FIG. 11 is a graph illustrating the combined leakage current and transient supply current associated with a device under test.

FIG. 11 illustrates transient supply current pulses in combination with a high DC leakage current. Each 180 µA peak transient supply current pulse 724, indicative of, for example, single-cell SRAM switching, is illustrated in the presence of the 10 mA of supply current leakage 725 that is present in large, 1 MB or larger, SRAM circuits. Since the leakage current is significantly larger than the transient current pulses to be measured, the affects of the leakage current are preferably removed using AC coupling or a highpass filter network operating on the voltage resulting from the supply current flowing through a resistance.

Figure 12:
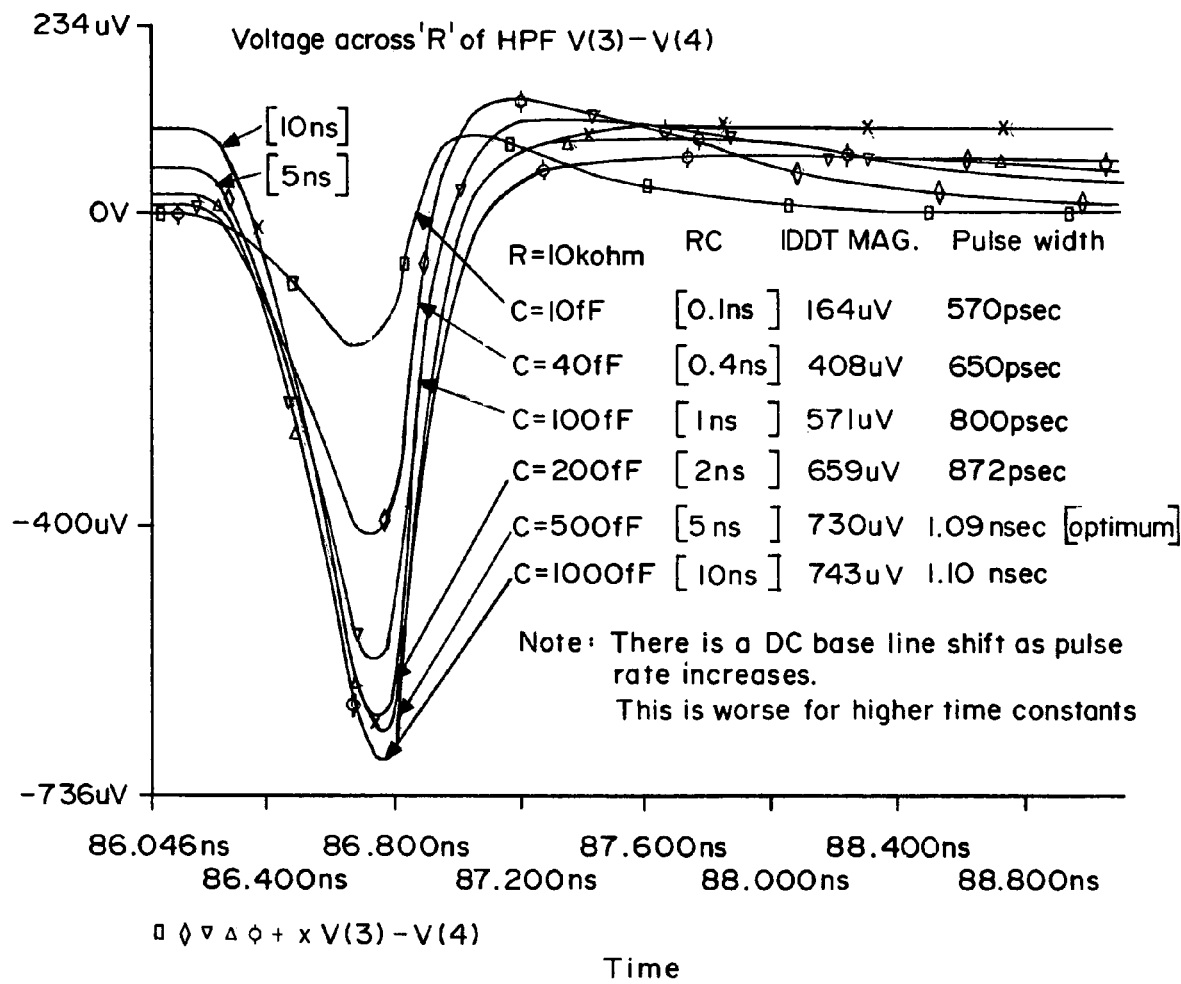
FIG. 12 is a graph illustrating the transient voltage pulses as a function of RC high-pass circuit time constants.

Referring to FIG. 12, the AC coupled or highpass filtered transient voltage pulses are shown as a function of RC circuit time constants. The transient voltage pulses are nearly fully preserved for time constants of about 5 ns and greater. However, there is a DC baseline shift at high repetition rates that is larger for these higher time constant values. Therefore, the preferable time constant value represents a compromise of some signal pulse loss combined with a manageable level of DC baseline shift. The selection of highpass time constant is dependent upon the width of the voltage pulse and the repetition rate desired for circuit testing. Operation at lower time constants where some signal is lost will permit testing at higher clock rates as the highpass circuit acts as a differentiator where its output overshoot minimizes the resulting DC baseline shift (the areas below and above the baseline must be equal).

Figure 13:
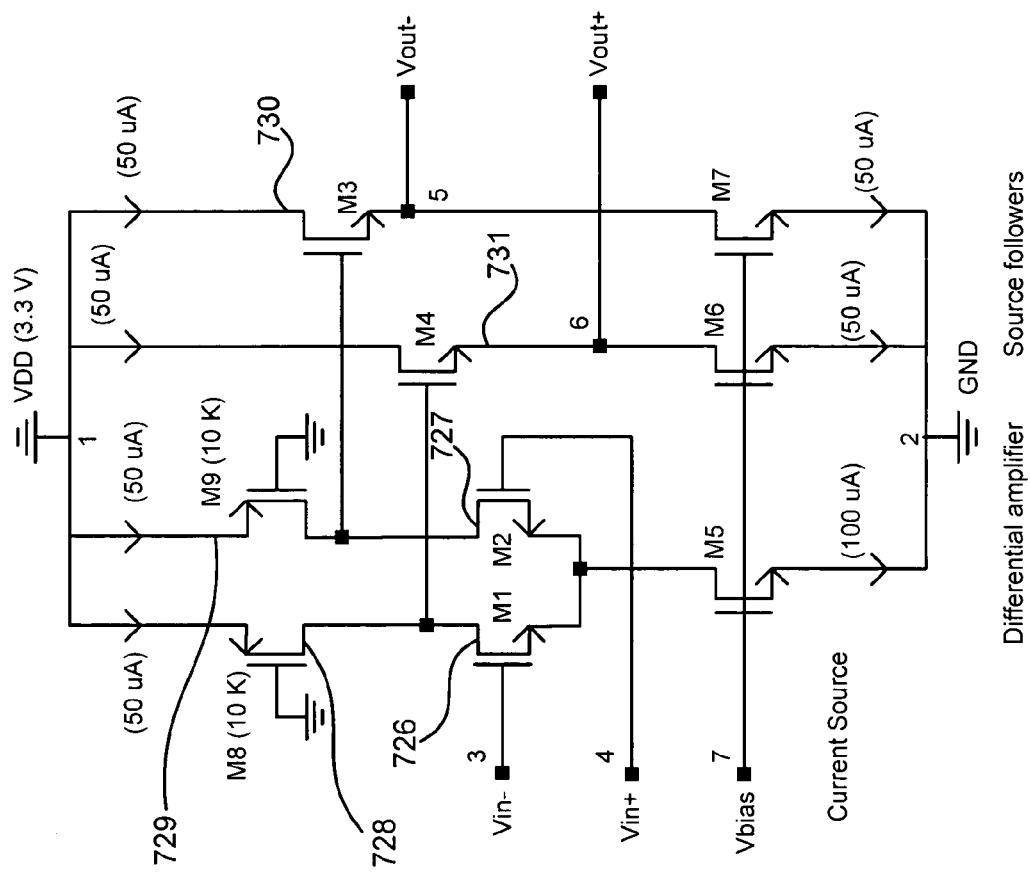
FIG. 13 is an electrical schematic of an amplifier for use with an embodiment of the present invention.

The amplifiers are used to amplify the transient voltage pulse to a level permitting an assessment of the $I_{DDT}$ level. As is shown in FIG. 13, suitable amplifiers include at least two MOS devices 726, 727 as a differential pair driving a second set of MOS devices 728, 729 that act as resistive loads. A last two other MOS devices 730, 731 are provided as source followers providing DC level shifting and low output impedance to drive the subsequent amplifier stage. The voltage gain for each amplifier stage is given by:

$$A_v = \left[\frac{g_{m726}}{g_{ds728}}\right]\left[\frac{g_{m730}}{g_{m730} + g_{mb730}}\right], \quad (1)$$

where $g_{m726}$ ($g_{m727}$) is the transconductance of MOS device 726 (727), $g_{ds728}$ ($g_{ds729}$) is the output conductance of MOS device 728 (729), and $g_{m730}$ ($g_{m731}$) and $g_{mb730}$ ($g_{mb731}$) are the transconductance and body-effect transconductance of MOS device 730 (731). The first term of (1) is the voltage gain of the differential pair (726 and 727) driving resistive loads consisting of 728 and 729 that operate in the ohmic, linear, or triode region. The second term is the voltage gain of the source followers where some gain loss below unity occurs due to the presence of body-effect transconductance. The selection of amplifier stage gain and bandwidth depends upon the particular test application and includes factors such as the gain required and bandwidth required to preserve the narrow transient voltages. Additionally, the number of amplifier stages depends upon the test application with higher sensitivity applications (e.g., SRAM testing) requiring more stages compared to lower sensitivity applications (e.g., combination logic testing) requiring less stages.

In one embodiment, the apparatus and methods of the present invention includes autozeroing circuitry and steps to remove the DC errors associated with DC supply current leakage or the DC offset errors associated with practical implementations of amplifiers or a cascading of amplifiers used to amplify the signal associated with the transient supply current. In one embodiment, the autozeroing circuitry includes capacitive autozero circuits where the DC error associated with the DC supply current leakage or the DC offset errors associated with the amplifiers or cascading of amplifiers is stored on a capacitor or capacitors during an autozero phase. In a subsequent signal phase, the desired transient supply signal is coupled through the capacitor or capacitors while removing the undesired dc error associated with DC supply current leakage and/or DC offset errors. The autozero and signal phases can be controlled by the digital system clocking or otherwise controlling the DUT or DUT's. In another embodiment, the autozero circuitry includes continuous-time or gated negative feedback circuits where any amplifier output or outputs of cascaded amplifiers are compared to a reference voltage or reference voltages, including ground, in a circuit or circuits that then apply the required signal or signals to cancel the DC error. This negative feedback correction of the DC error can be applied at each stage of a cascaded amplifier or at selected stages. Gated negative feedback autozeroing can be enabled during an autozero phase and disabled during a signal phase to prevent any undesired cancellation of the desired transient supply signal. These phases can be controlled using the digital system clocking within the DUT or by otherwise controlling the DUT or DUT'S. Continuous-time negative feedback autozeroing requires no additional control and can run continuously.

In one example of autozeroing, a CMOS amplifier stage has a DC input offset voltage associated with the mismatches in the MOS devices. This DC input offset will be approximately 2 to approximately 20 mV (3 sigma), a level that is well above the transient input voltage pulse. Therefore, some form of a MOS input autozero circuitry is preferred for the amplifiers. Suitable autozero circuitry will store the input offset voltage across a capacitor during the autozero mode. In the signal mode, this capacitor would be placed in series with the voltage pulse to be measured and the amplifier input, thereby passing the narrow voltage pulse while subtracting out the input offset voltage. The two modes of operation, autozero and signal, can be controlled by the clocking system associated with testing of digital circuits. Here, the autozero mode can be invoked while digital test stimuli are being initialized. During actual $I_{DDT}$ measurement, the MOS autozero circuit can be placed in the signal mode.

Figure 14:
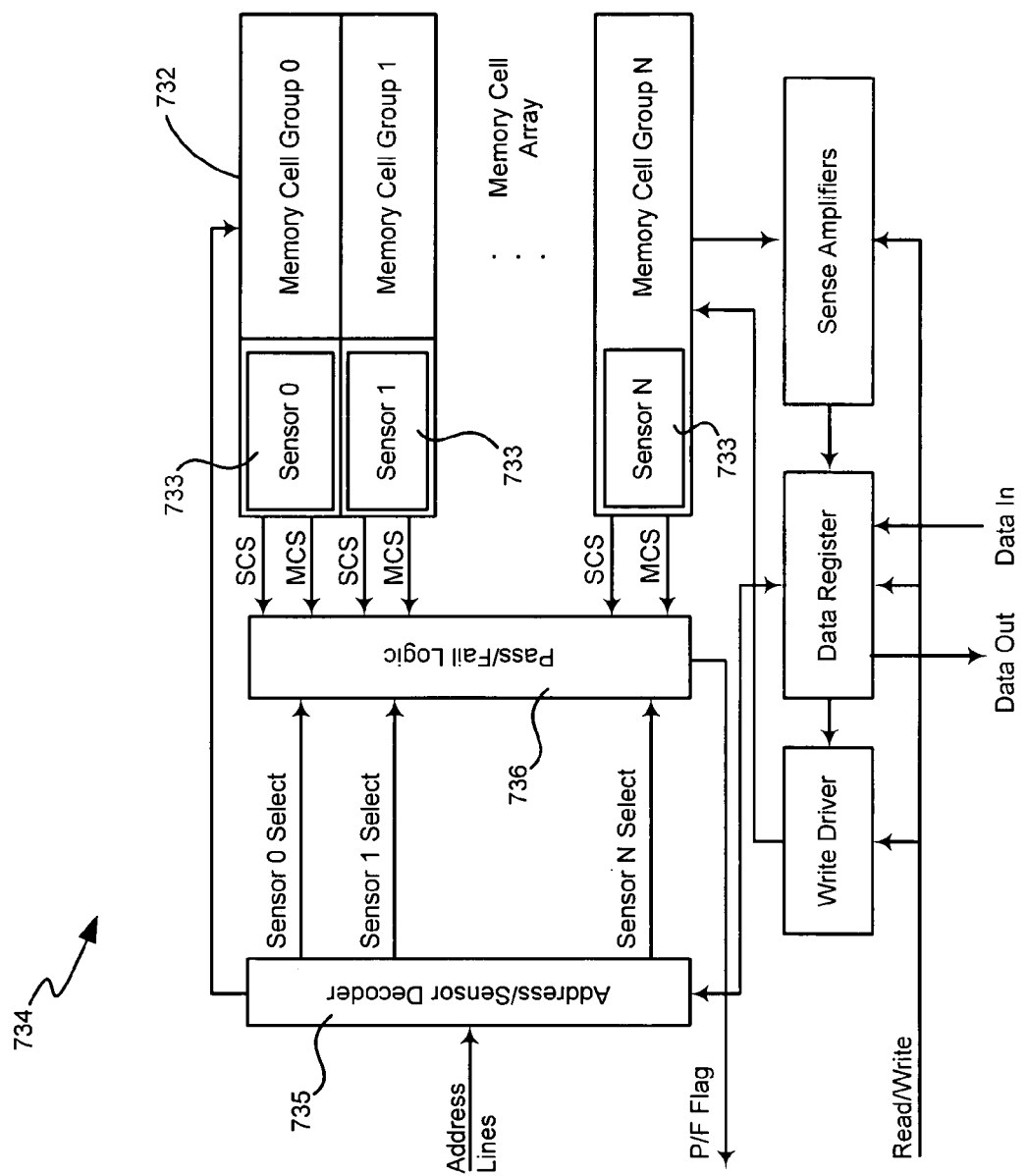
FIG. 14 is a schematic representation of sensors embedded in a Static Random Access Memory device under test.

Referring to FIG. 14, an embodiment of an SRAM 734 as the DUT with embedded sensors is shown. The SRAM array 732 is divided into several large groups of SRAM cells. Sensors 733 are embedded in the SRAM in such a way as to monitor the $I_{DDT}$ for each group of cells, because the total normal leakage current can be large enough to prevent the sensor from distinguishing $I_{DDT}$ In an alternative embodiment, a single sensor is used and switches are provided that allow the sensor to monitor several different groups of cells in the array.

By way of example, for an SRAM size of $2^L$ words and a cell group size of $2^M$ words, where the word size can be 8–512 bits wide, the sensor selection is accomplished by decoding the L-M high-order bits of the address lines. This decoding can be performed by the address decoder 735. A Pass/Fail logic block 736 is provided to process the outputs of the sensors 733 into a Pass/Fail indication. SCS and MCS represent Single Cell Switching and Multiple Cell Switching conditions respectively, representing different fault conditions.

Figure 15:
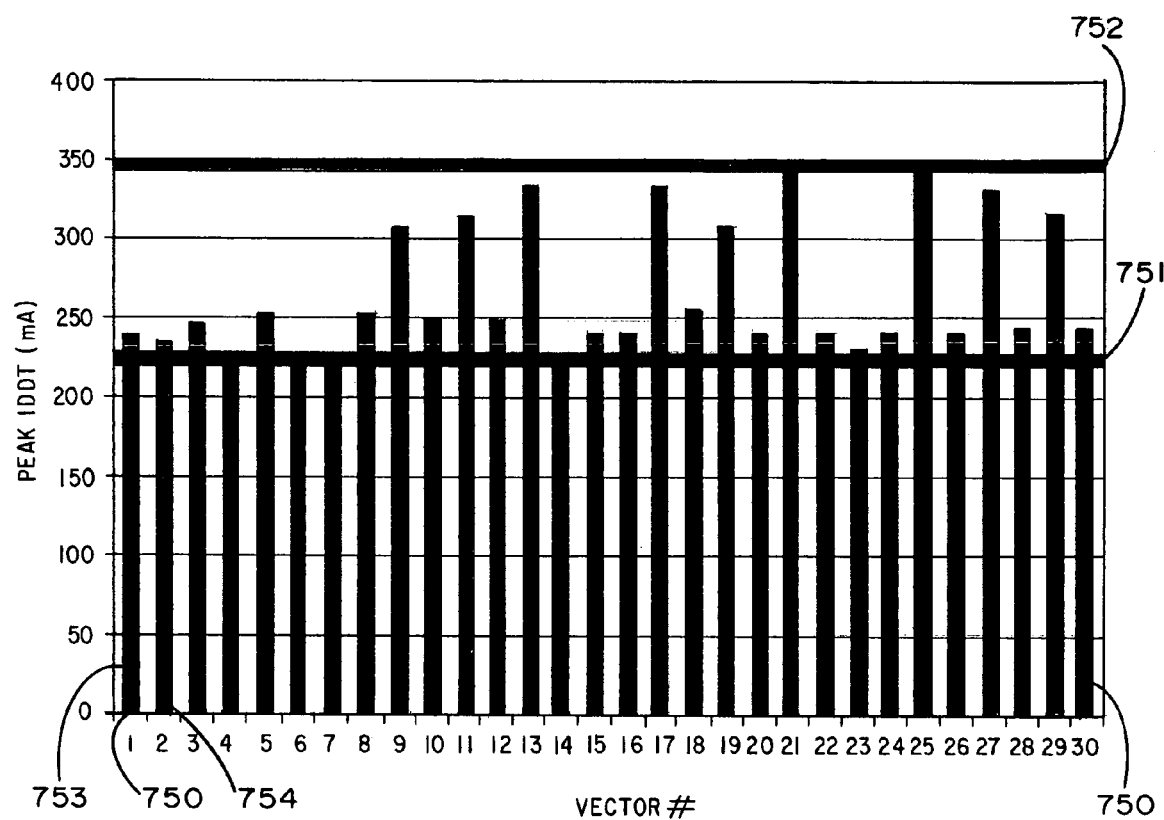
FIG. 15 is a bar graph illustrating complementary pairs of transient current spikes in a device under test.

In another embodiment of the method of the present invention, the difference in the peak values of two transient supply voltages, $I_{DDT}$, are compared to stored values for this difference associated with fault-free circuits. Deviations from the stored difference values indicate a fault or defect in the tested circuits. As is illustrated in FIG. 15, a fault-free electronic device or circuit that contains random logic is exposed to a plurality of input signal vectors, each vector selected to exercise different circuit nodes within the electronic device. The vectors generate a plurality of peak transient currents 750. Each input vector that causes the output of a random logic circuit to transition from logic 0 to logic 1 has a corresponding vector that causes the output to transition from logic 1 to logic 0 along the same path. Such vector pairs will be referred to as complimentary vectors. These complimentary input vector pairs generate a corresponding pair of $I_{DDT}$ peak values. As illustrated, the electronic device is exposed to 30 vectors that generate 30 different values of $I_{DDT}$ arranged as 15 pairs of complementary peaks, for example a first peak 753 and a second complementary peak 754.

The peaks are represented by bars extending upwards between a lower current level 751 and an upper current level 752. There is no transient current response less than the lower current level 751 or greater than the upper current level 752 for the given vectors. Therefore, complementary pairs of current peaks have a specific difference in value. The upper and lower current levels define and bound this difference between a lower value and an upper value. As illustrated, the difference is bound between 0 and 112 µA. In order to test a device, the device is exposed to one or more of the complementary pairs of vectors associated with a pair of baseline transient current peaks, for example 753,754, and the generated complementary values of $I_{DDT}$ are measured. The differences between the generated transient current pairs are calculated. If these calculated differences are within the upper and lower bounds of differences as shown for the fault-free device, the tested device passes. If the calculated differences are outside the upper and lower bounds, then the tested device fails, indicating a defect or fault.

This method provides the unexpected results and advantages that the difference between transient current peaks cancels the quiescent part of the current response, and hence reduces the effect of leakage currents. In addition, a defective device circuit can draw $I_{DDT}$ spikes with peak magnitudes that are within the good circuit limits or slightly outside the limits; however, the difference of such peak magnitudes can amplify the abnormal behavior of $I_{DDT}$ and produce a value outside the good circuit limits as defined by the difference in $I_{DDT}$ spikes. For example as illustrated in FIG. 15, a resistive open of 100 kΩ at the gate of a PMOS transistor will produce, in response to the first two input vectors 753,754, $I_{DDT}$ spikes with values of 327 and 147 µA respectively. The difference in the peak magnitudes of $I_{DDT}$ in response to this complimentary pair is 4 µA for the illustrated fault-free circuit and 180 µA for the tested defected device, indicating a defect.

In an alternative embodiment of the method of the present invention utilizing the upper bound 752 and the lower bound 751 of the peak transient currents illustrated in FIG. 5, these bounds are used as a threshold measurement for the tested device. Since a fault-free circuit will have transient current peaks within the lower bound and the upper bound of peak $I_{DDT}$ values in response to selected input vector pairs, a circuit drawing a peak $I_{DDT}$ value either lower than the lower bound or higher than the upper bound, including any addition tolerances, is defective. Therefore, vectors are applied to a device under test, and the peak transient currents are recorded and compared to acceptable range for these peak currents. As an example, the peak values of the $I_{DDT}$ spikes range from 220 to 350 µA. A resistive open of 100 kΩ at the gate of the PMOS transistor will produce, in response to applied vectors, two $I_{DDT}$ spikes with values of 327 and 147 µA. The second spike is 33% lower than the lower bound, indicating a defect. The threshold tolerance for fault indication was set to 20%, that is a faulty $I_{DDT}$ is 20% lower or higher than the limits for a fault-free device $I_{DDT}$. In a preferred embodiment of this method, the set of test vectors defining the upper and lower bounds is selected such that no test vector to be applied to the device to be tested that is outside the set of defining vectors will produce $I_{DDT}$ outside the minimum and maximum bounds.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended Claims. The embodiments set forth herein are provided to fully convey the scope of the invention to one of skill in the art. Although specific terms are employed herein, they are used in a generic and descriptive sense only and not for purposes of limitation.

What is claimed is:

1. An apparatus for determining defects and faults in an electronic device having at least one input that are coupled between a power supply and a ground to receive a supply current therefrom, the apparatus comprising:
   a first resistor electrically coupled between the power supply and the device under test to convert the supply current to a signal voltage related to the supply current;
   an AC coupled high pass filter electrically coupled between the first resistor and the device under test to differentiate between the desired signal voltage related to a transient supply current pulse and signal voltage related to supply current leakage in the device under test; and
   a plurality of cascading amplifiers electrically coupled to the high pass filter to amplify the signal voltage related to the transient supply current pulse from the AC coupled high pass filter.

2. The apparatus of claim 1, further comprising a comparator for comparing the amplified transient signal voltage to predetermined voltage values for normal device operation to determine if faults exist.

3. The apparatus of claim 1, wherein the high pass filter comprises at least one second resistor and at least one capacitor.

4. The apparatus of claim 1, further comprising four cascading amplifiers.

5. The apparatus of claim 4, wherein each amplifier has a voltage gain of about 4 and a 3 dB bandwidth of about 1.6 GHz, producing a composite voltage gain of about 233 MHz and a composite bandwidth of about 550 MHz.

6. The apparatus of claim 1, further comprising autozero circuitry to compensate for errors associated with supply current leakage or DC offset errors associated with the plurality of cascading amplifiers.

* * * * *